United States Patent [19]

Sharma et al.

[11] Patent Number: 5,344,524
[45] Date of Patent: Sep. 6, 1994

[54] SOI SUBSTRATE FABRICATION

[75] Inventors: Kalluri R. Sharma, Mesa, Ariz.; Michael S. Liu, Bloomington, Minn.

[73] Assignee: Honeywell Inc., Minneapolis, Minn.

[21] Appl. No.: 85,422

[22] Filed: Jun. 30, 1993

[51] Int. Cl.$^5$ ......................................... H01L 21/306
[52] U.S. Cl. .................................... 156/630; 437/62; 437/974; 148/DIG. 12
[58] Field of Search ..................... 156/630; 437/61, 62, 437/974; 148/DIG. 12

[56] References Cited

U.S. PATENT DOCUMENTS

| | | | |
|---|---|---|---|
| 4,771,016 | 9/1988 | Bajor et al. | 437/974 |
| 4,883,251 | 11/1989 | Goesele et al. | 148/DIG. 12 |
| 4,983,251 | 1/1991 | Haisma et al. | 156/630 |
| 5,013,681 | 5/1991 | Godbey et al. | 437/974 |
| 5,032,544 | 7/1991 | Ito et al. | 148/DIG. 12 |
| 5,240,876 | 8/1993 | Gaul et al. | 437/974 |
| 5,258,323 | 11/1993 | Sarma et al. | 437/62 |

OTHER PUBLICATIONS

Maszara et al., "Bonding of Silicon Wafers for Silicon-on Insulator," J. Appl. Phys 64(10), Nov. 15, 1988; pp. 4943–4950.

"Plasma Thinned SOI Bonded Wafers" by P. Mumola et al., pp. 152–153, IEEE article 0-7803-0776–Mar. 1992.

"Predicted Polishing Behavior of Plasma Assisted Chemical Etching (PACE) from a Unified Model of the Temporal Evolution of Etched Surfaces," by G. Gallatin et al., pp. 98–107 in vol. 966 of SPIE Advances in Fabrication and Metrology for Optics and Large Optics.

"Rapid, Nonchemical, Damage-Free Figuring of Optical Surfaces Using Plasma-assisted Chemical Etching: Part I Experimental Results," by L. D. Bollinger et al., pp. 82–90 in vol. 966 of the SPIE Advances in Fabrication and Metrology for Optics and Large Optics.

"Rapid, Nonmechanical, Damage-free Figuring of Optical Surfaces Using Plasma-assisted Chemical Etching (PACE): Part II Theory and process Control," by C. B. Zarowin et al, pp. 91–97, vol. 966 of SPIE Advances in Fabrication and Metrology for Optics and Large Optics.

*Primary Examiner*—Brian E. Hearn
*Assistant Examiner*—Trung Dang
*Attorney, Agent, or Firm*—John G. Shudy, Jr.

[57] ABSTRACT

A back-etch silicon-on-insulator SOI process that has a silicon handle wafer with an oxide layer bonded at room temperature to a silicon device wafer with an etch stop and silicon device layer. The surfaces that are bonded at room temperature are first conditioned to be hydrophilic. After bonding, the edges of the layers are sealed. The silicon device wafer, the etch-stop layer and the device layer are boron doped. Most of the silicon device wafer is ground away. Then, the remaining portion of the silicon device wafer and the etch stop layer are chemically etched away, thereby leaving a uniform layer of silicon device layer on the oxide layer of the silicon handle wafer. Because the bonding, grinding and selective etching are performed at room temperature, inter-diffusion of the boron between the various layers is prevented and thus permits the selective etching process to result in a nearly perfect silicon device layer in terms of an even-surfaced, defect-free and thin layer on the buried oxide layer of silicon handle wafer. The resulting SOI wafer is then annealed at a high temperature, prior to device processing.

19 Claims, 6 Drawing Sheets

SOI SUBSTRATE FABRICATION

BACKGROUND OF THE INVENTION

The invention pertains to silicon-on-insulator (SOI) transistor technology and particularly to SOI transistor substrates. More particularly, the invention pertains to silicon-on-insulator fabrication.

SOI technology has been an active area of development since the late nineteen seventies due to its potential for superior performance compared to bulk silicon devices for high speed and very large scale integration (VLSI) integrated circuit applications. In addition, SOI devices, circuits, and systems can provide satisfactory performance under harsh environments such as high energy radiation, and high temperatures (e.g., greater than 300 degrees Centigrade), associated with military, space, and automobile applications. At present, while some SOI circuits (mainly based on thick film having a thickness greater than 0.3 microns) are in production, the full potential of the SOI technology has not been realized primarily due to the difficulties in the fabrication of the SOI structure with the necessary silicon thickness value, thickness uniformity, and low defect (dislocation) densities. For example, high speed and low noise circuits, and high temperature and radiation-hard applications require a fully depleted mode of SOI device operation. This operation in turn requires defect-free silicon films having a very small thickness (less than 0.25 micron) and uniform thickness (less than a plus or minus 50 Angstroms variation). These thin film characteristics have not been satisfactorily achieved using related-art SOI fabrication technologies.

FIG. 1 is a diagram of a related-art schematic of the separation by implantation of oxygen (SIMOX) process for fabricating SOI substrates. The SIMOX process is the predominantly used process. The process involves a high dose (about $1.8 \times 10^{18}/cm^2$) implantation of oxygen atoms 12 at an energy of about 200 KeV into silicon wafer 14. After the implantation, wafer 14 is annealed at about 1300 degrees Centigrade (C) for a long duration, that is, about five hours, resulting in a buried $SiO_2$ layer 16, and a thin silicon layer 17. SIMOX process results in excellent silicon thickness control and uniformity, which was the reason for its early acceptance. However, the disadvantages of the SIMOX process include high defect density, and oxide pinhole defects. Oxide pinhole defects are a consequence of the particulate shadowing of the oxygen ion beam during implantation. Pinhole defects result in low device yields. In spite of the extensive annealing after implantation, the dislocation density in the SIMOX material is high and ranges from $10^5$ to $10^6/cm^2$. This high defect density limits the maximum achievable performance of the resulting CMOS circuits and limits high speed and low noise in bipolar circuits. Due to these limitations of the SIMOX process, several variations of a bonding and etch-back SOI (BESOI) approach have been tried.

FIG. 2 shows one variation of the BESOI approach which does not involve use of an etch-stop layer. In this process, a silicon handle wafer 18 and the silicon device wafer 20 having an oxide layer 22 are fusion bonded at about 1000 degrees C. This results in an intimate bonding of the two silicon wafers 18 and 20, with buried oxide layer 22 in between. Then most of the device wafer 20 is removed by grinding and lapping. This is followed by a final high precision chemical/mechanical polishing. While the silicon device layer produced using this approach is defect free, its thickness is typically about 2 microns, with a plus or minus 0.5 micron variation. The large thickness value and variation are not satisfactory for the SOI devices requiring a fully depleted mode of operation.

FIG. 3 shows the second variation of the BESOI approach which involves use of an etch-stop layer 23. In this process, a silicon handle wafer 18 with a buried oxide layer 22, and a silicon device wafer 20 ($p^-$) with the etch-stop layer 23 and epitaxial layer 21 are fusion bonded together at about 1000 degrees C. Buried oxide 22 on silicon handle wafer 18 is prepared by thermal oxidation. Etch-stop layer 23 is essentially a highly boron doped ($p^{++}$) single crystal silicon layer. It is produced by epitaxial deposition. After depositing the etch-stop layer, a lightly boron doped ($p^-$) silicon device layer 21, with the desired thickness is epitaxially deposited. After the fusion bonding, the SOI substrate preparation process involves grinding (to remove most of silicon device wafer 20), and preferential chemical etching to remove the remaining silicon device wafer 20, and etch-stop layer 23. Unfortunately, due to interdiffusion of the boron from the highly doped etch-stop layer 23 into thin lightly doped device layer 21 during the high temperature fusion bonding process, reliability of the etch-stop layer is severely affected. Furthermore, control of the device layer 21 thickness and its uniformity become very difficult, thereby resulting in an unsatisfactory process for obtaining a thin, uniform silicon device layer for a fully depleted mode of SOI device operation. This approach has not been very successful.

FIG. 4 shows the localized plasma thinning approach. This process starts with an SOI wafer such as the one produced by BESOI process without an etch-stop 23 (of FIG. 2), with a thick silicon film 21 of typically about 2 microns with a thickness variation of about plus or minus 0.5 micron. Initially, silicon film thickness and its uniformity across the SOI wafer surface are measured and mapped. Using this thickness profile information, a localized plasma etching apparatus 24 is utilized to locally etch the device layer 21 with $CF_4 + O_2$ plasma, while the SOI substrate is being translated in a pre-programmed fashion under apparatus 24, to reduce the thickness of the silicon film 21 to the desired value. The thickness mapping and localized etching procedures may be repeated as required to achieve the desired silicon device layer 21 thickness and uniformity at a value between 0.1 to 0.3 microns and the thickness having a surface variation of about plus or minus 100 Angstroms. While the basic feasibility of this localized thinning approach has been demonstrated, the cost of this process and the quality of the plasma etched silicon surface are issues that remain to be resolved for the fabrication of high quality SOI circuit substrates at low cost.

Thus, there is still a need for the development of a process to produce SOI substrates with defect free, thin, uniform silicon films for fully depleted mode of device operation, at low cost. The present invention is the answer to that need.

SUMMARY OF THE INVENTION

The invention is a back-etch silicon-on-insulator process that has a silicon handle wafer with a buried oxide layer bonded at room temperature to a silicon device layer with an etch-stop layer and silicon device layer. The silicon device wafer, the etch-stop layer and the device layer are boron doped. The surfaces to be bonded at room temperature are conditioned to be hydrophilic. After bonding, the edges of the layers are sealed using an adhesive. Most of the silicon device wafer is ground away. Then, the remaining portion of the silicon device wafer and the etch stop layer are chemically etched away, selectively, thereby leaving a uniform layer of device silicon on the silicon handle wafer. Because the bonding, grinding and selective etching are performed at room temperature, inter-diffusion of the boron between the silicon device wafer 20 and etch-stop layer 23, and the device layer 21 is prevented and this permits the selective etching process to result in a nearly perfect silicon device layer in terms of an even-surfaced, defect-free and thin layer on the buried oxide layer of silicon handle wafer. The resulting SOI wafer is then annealed at a high temperature for enhanced bonding of the silicon device layer to the buried oxide. The silicon device layer thickness in this SOI wafer can be reduced further, when desired, using controlled thermal oxidation and etching of the resulting oxide. Thermal oxidation and oxide etching are very uniform processes, and result in very uniform thinning of the silicon device layer to a desired thickness.

The process of the present invention results in defect-free SOI substrates which are satisfactory for the fully depleted mode of device operation having the required silicon film thickness and uniformity, and for the fabrication of SOI circuits for the radiation-hard and high temperature applications.

DESCRIPTION OF THE PREFERRED EMBODIMENT

Figure 1:
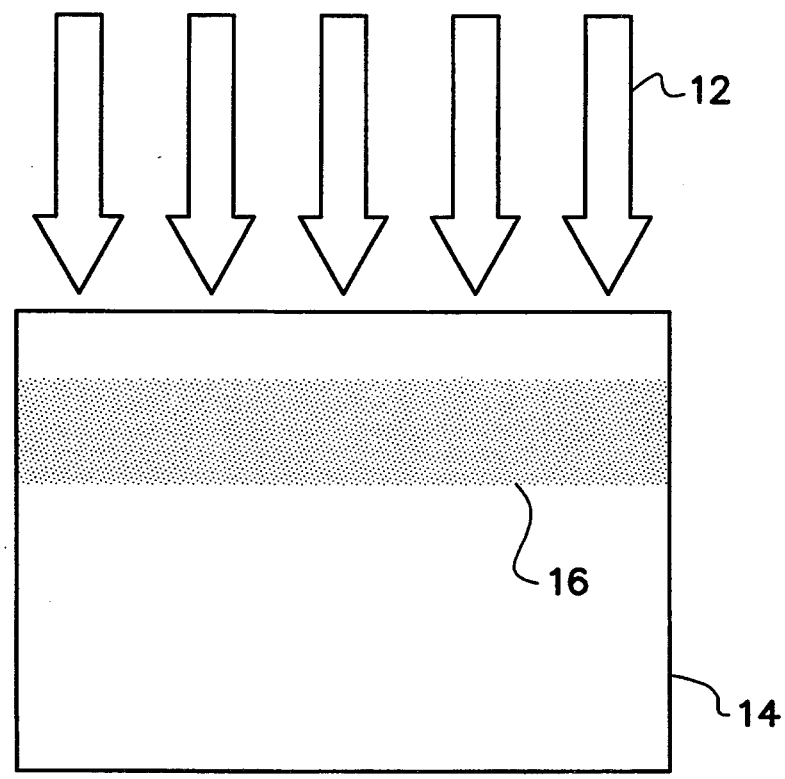
FIG. 1 illustrates a SIMOX SOI substrate fabrication process.
Figure 1:
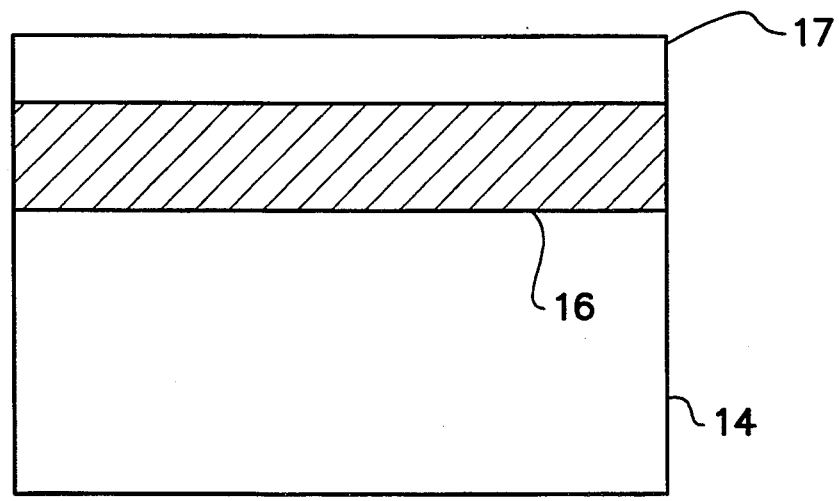
Figure 2:
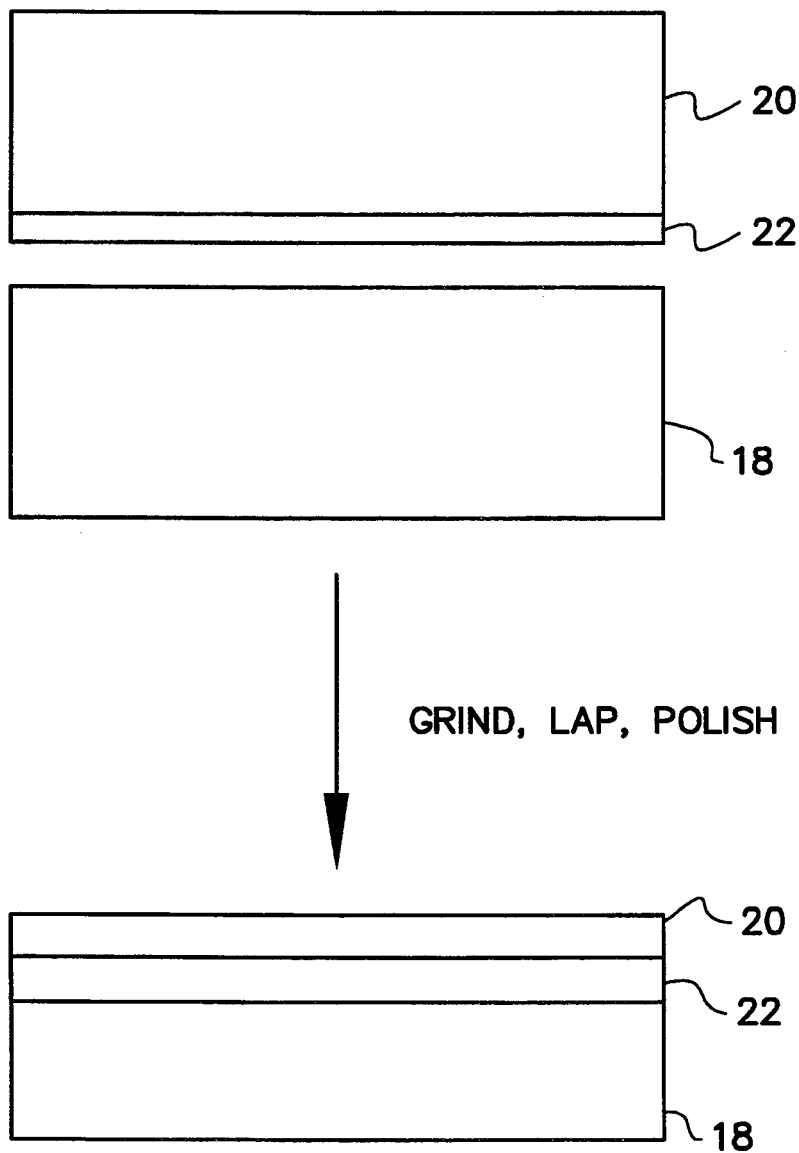
FIG. 2 illustrates a BESOI substrate fabrication process without an etch stop layer.
Figure 3:
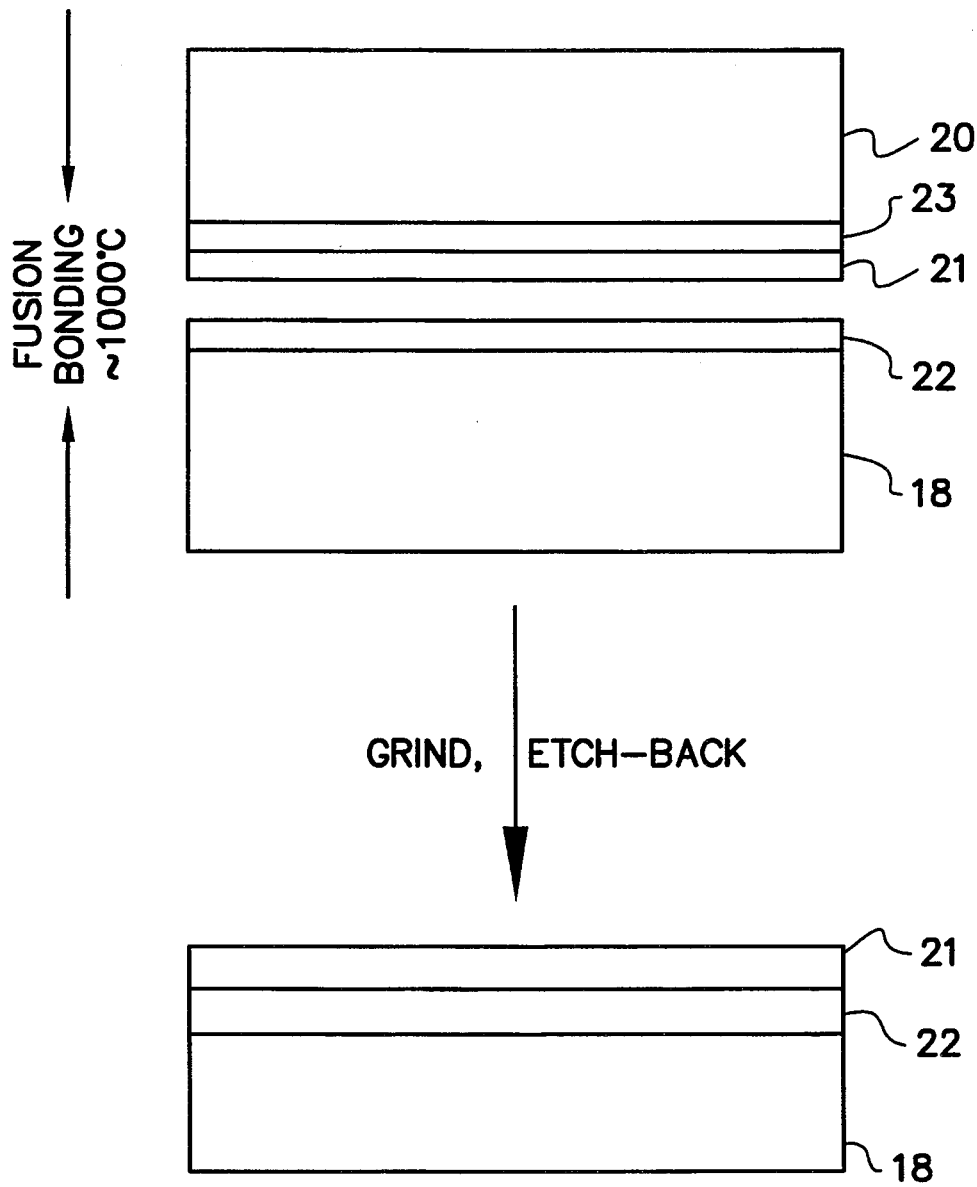
FIG. 3 illustrates a BESOI substrate fabrication process with an etch stop layer.
Figure 4:
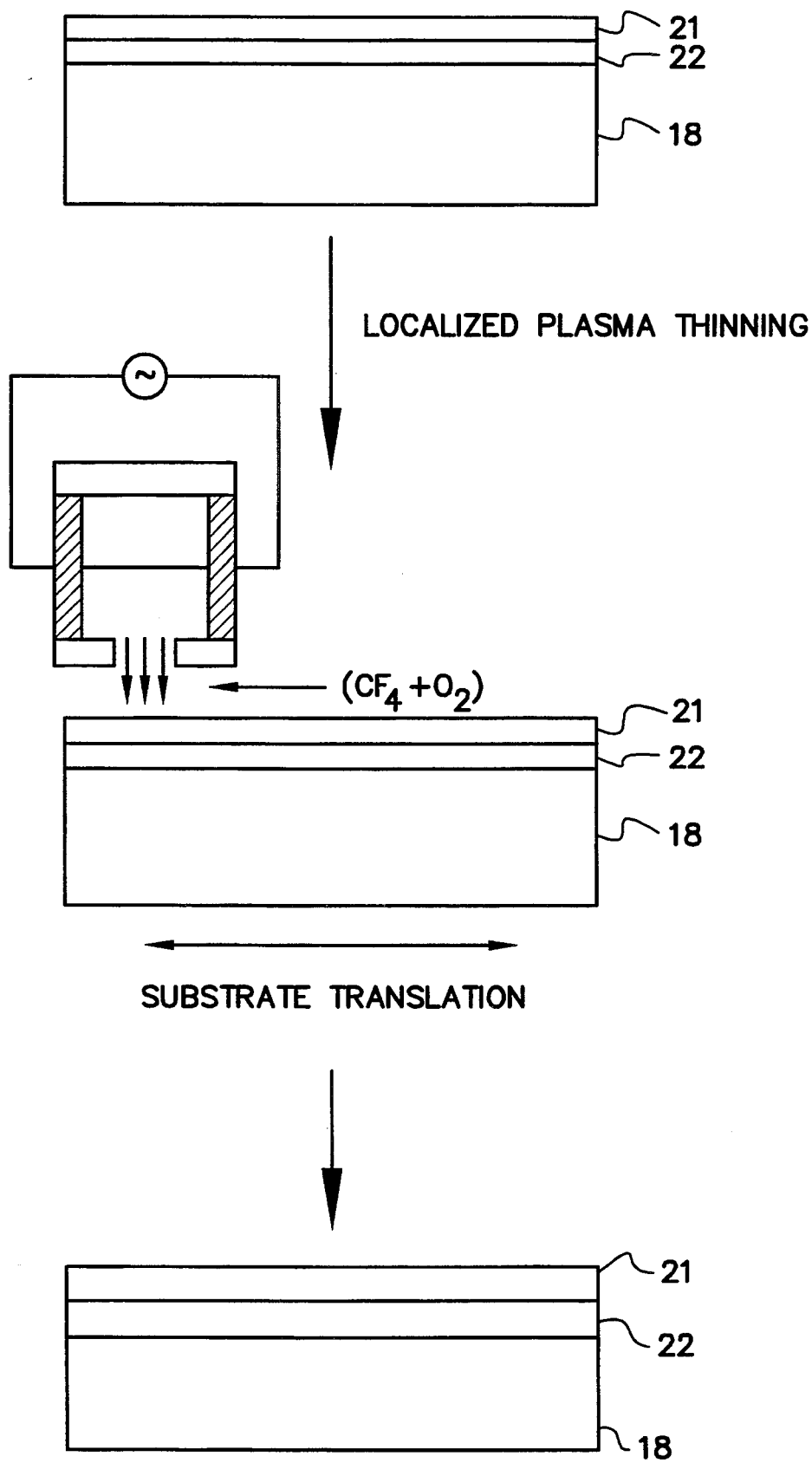
FIG. 4 illustrates a localized plasma thinning SOI substrate fabrication process.
Figure 5:
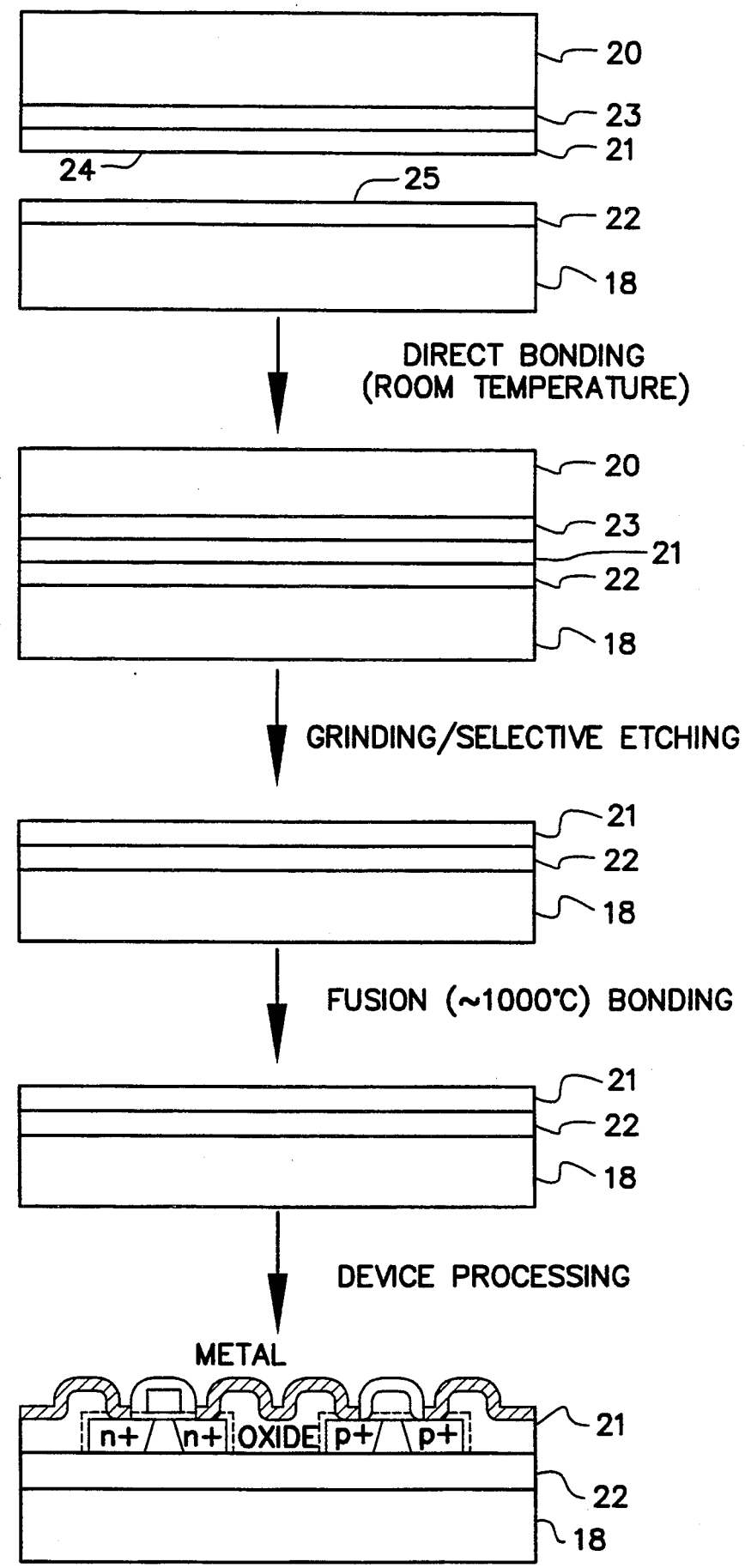
FIG. 5 illustrates a room temperature bonding SOI substrate fabrication process.

FIG. 5 illustrates the process according to the present invention for producing an SOI substrate sufficient for a fully depleted mode of device operation. Buried oxide 22 on silicon handle wafer 18 is prepared by thermal oxidation. Thermal oxidation is effected by inserting silicon handle wafer 18 in an oxidation furnace, in a steam ambient at 1000 degrees C. for 4 hours. Etch-stop layer 23 is essentially a highly boron doped (p++) single crystal silicon layer. It is produced by epitaxial deposition. After depositing a p++ etch-stop layer 23 of about 2.0 microns, a lightly boron doped (p−) single crystal silicon device layer 21, with the desired thickness is epitaxially deposited. For a silicon device layer 21 thickness in the range of 0.2 micron or higher, epitaxial deposition alone can be used to control the layer thickness. For thinner device layers, for example 0.1 microns, controlled thermal oxidation of the silicon in the SOI structure, and oxide etching is used.

In this process, silicon handle wafer 18 with buried oxide layer 22, and silicon device wafer 20 with an etch-stop layer 23 are bonded at room temperature. The room temperature bonding is accomplished by conditioning the surfaces to be bonded to be hydrophilic, and contacting the two surfaces 24 and 25 together. For example, silicon and silicon dioxide surfaces can be made to be hydrophilic by cleaning them in an RCA solution such as RCA #1—1NH$_3$: 5H$_2$O: 1H$_2$O$_2$; or RCA #2—1HCl:6H$_2$O:1H$_2$O$_2$. This wafer cleaning procedure is also designed to remove any particulate matter from the surfaces to be contacted and bonded. Particulates result in void formation at the bond interface which causes device yield loss. To ensure adequate bond strength, for the subsequent thinning operations, the composite is then edge sealed using an adhesive such as epoxy, at the bond perimeter.

After bonding, most of silicon device wafer 20 is then removed by grinding and lapping down to about 20–50 microns of wafer 20 remaining. The starting silicon device wafer 20 thickness is typically in the range of 520–550 microns. Then selective chemical etching is utilized to remove remaining silicon wafer 20 and etch-stop layer 23. The thickness of device layer 21 may be anywhere from 0.01 to 2 microns but the preferred thickness is about 0.2 microns, having a surface variation within plus and minus 50 Angstroms. Then the SOI wafer consisting of thin uniform silicon device layer 21, buried oxide layer 22 and silicon handle wafer 18 is annealed at about 1000 degrees C., for 2 hours in a nitrogen ambient, for fusion bonding of silicon device layer 21 for improved bond strength. Then this SOI wafer is processed through the conventional CMOS/-Bipolar process sequence using conventional SOI device processing technologies. Note that, further thinning of silicon device layer 21 can be accomplished after fusion bonding, if required, by controlled thermal oxidation and removal of the oxide formed.

Figure 6:
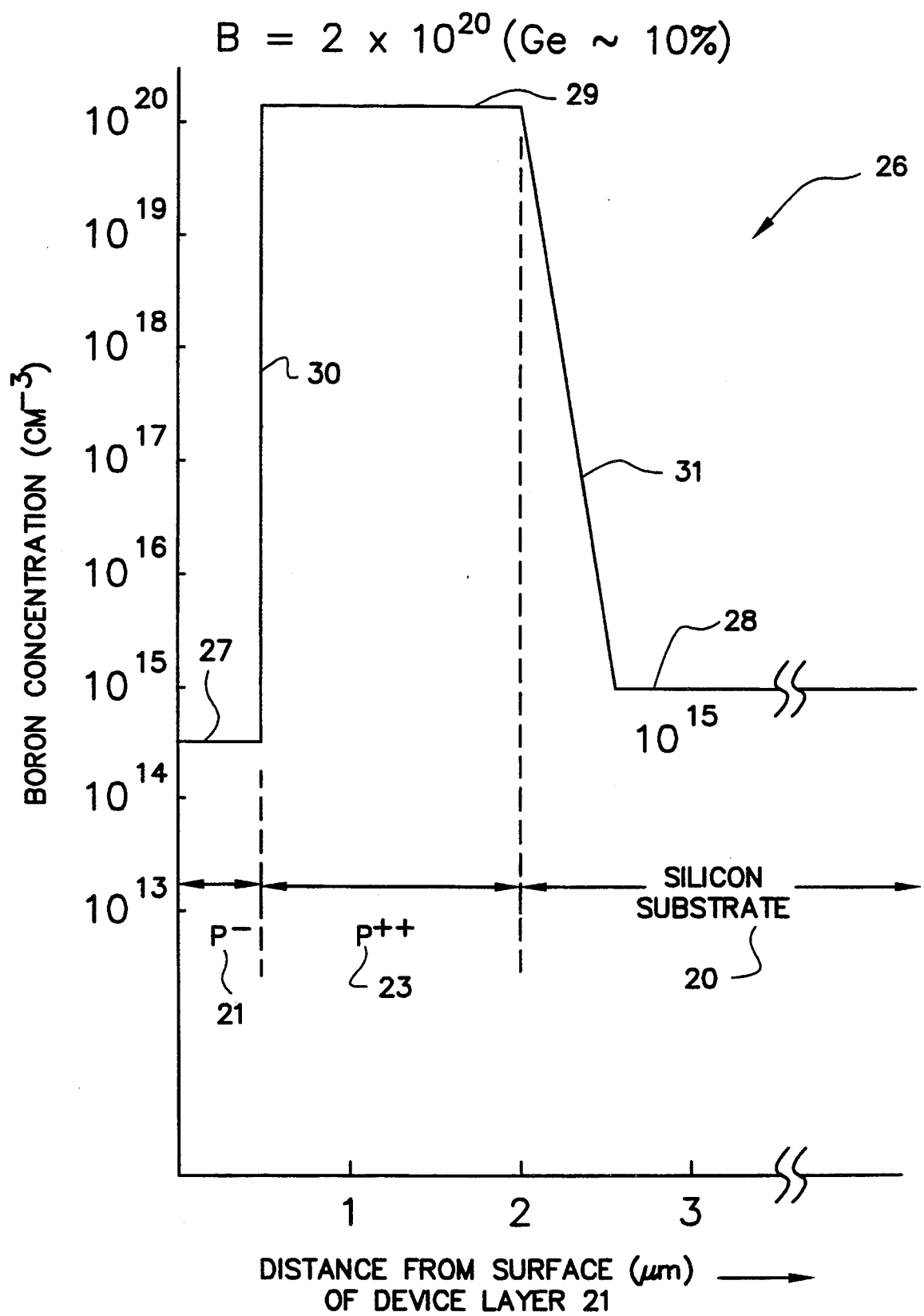
FIG. 6 is a graph showing the boron concentration profile through the silicon device layer and the etch-stop layer on the silicon device wafer.

FIG. 6 shows the boron concentration profile 26 through silicon device substrate 20, with device layer 21 and etch-stop layer 23 prior to room temperature bonding. FIG. 6 also shows with curve 27 the boron concentration starting from the first surface of the device layer 21. The boron concentration, as shown by curve 28, in the starting silicon substrate is about $1 \times 10^{15}$/cm$^3$. Curve 29 indicates the boron concentration in the epitaxially deposited etch-stop (p++) layer 23 at about $2 \times 10^{20}$/cm$^3$. The boron concentration transition from $10^{15}$ to $10^{20/cm3}$ in silicon substrate 20 is shown by curve 31. Etch-stop layer 23 is co-doped with 10 percent germanium, using a GeH$_4$ source, to compensate the tensile stress created by the small boron atoms with the compressive stress due to larger germanium atoms. Etch-stop layer is about 2 microns thick. The boron concentration in silicon device layer 21 is less than $10^{15}$/cm$^3$. A final, desired thickness of the device layer 21 may be achieved by the subsequent controlled oxidation and oxide removal. The slope of boron concentration profile between etch-stop layer 23 and device layer 21 is maintained very steep as shown by curve 30 in FIG. 6 by employing a high epitaxial deposition rate (i.e., short time duration) for device layer 21. This steep slope 30 is important in achieving reliable selective etching to produce a thin and uniform silicon device layer.

Because the bonding, grinding and selective etching operations are all carried out at room temperature, there is no inter-diffusion of boron, and hence the selective etching processes work well as expected. Silicon substrate or device wafer 20 is selectively etched away using EDP (Ethylene Diamine and Pyrocatechol), which etches predominantly when boron concentration is less than $8 \times 10^{19}/cm^3$. Then etch-stop layer 23 is selectively etched away using 1 HF:3 HNO$_3$:8 HAc etchant (acetic acid) which etches predominantly when boron concentration is greater than $7 \times 10^{18}/cm^3$.

The embodiments of the invention in which an exclusive property or right is claimed are defined as follows:

1. A method for fabricating a silicon-on-insulator substrate, comprising:
    forming an etch-stop layer on a silicon device wafer;
    forming a device layer on the etch-stop layer;
    forming a dielectric layer on a silicon handle wafer;
    making exposed surfaces of the dielectric layer and the device layer hydrophilic;
    bonding the device layer and the dielectric layer at the exposed surfaces to each other at room temperature;
    removing the silicon device wafer; and
    removing the etch-stop layer wherein said removing steps are performed at room temperature.

2. The method of claim 1 further comprising sealing edges from the silicon device wafer to the silicon handle wafer subsequent to the bonding and prior to the removing of the silicon device wafer and the edge-stop layer.

3. The method of claim 2 further comprising annealing the bonding of the device layer and the dielectric layer.

4. The method of claim 3 wherein:
    the removing of the silicon device wafer is effected by grinding and etching; and
    the removing the of the etch-stop layer is effected by etching.

5. The method of claim 4 wherein the forming of the dielectric layer is effected by thermally oxidizing a surface of the silicon handle wafer.

6. The method of claim 5 wherein:
    the etch-stop layer is a heavily doped single crystal layer; and
    the device layer is a lightly doped single silicon layer.

7. The method of claim 6 wherein:
    the forming of the etch-stop layer is effected by epitaxial deposition; and
    the forming of the device layer is effected by epitaxial deposition.

8. The method of claim 7 wherein:
    the device layer has a thickness at a value set between 0.01 and 2.0 microns; and
    the device layer, subsequent to the removing of the etch-stop layer, has a surface variation within plus and minus 75 Angstroms.

9. The method of claim 8 wherein:
    the silicon device wafer is lightly doped (p$^-$) with boron;
    the etch-stop layer is heavily doped (p$^{++}$) with boron and co-doped with germanium; and
    the silicon device layer is lightly doped (p$^-$) with boron.

10. The method of claim 9 wherein:
    the making exposed surfaces of the dielectric layer and the device layer hydrophilic, prior to bonding the surfaces to each other, is effected by cleaning the exposed surfaces with an RCA solution;
    the removing of the silicon device wafer by etching is effected with an application of ethylene diamine and pyrocatechol; and
    the removing of the etch-stop layer by etching is effected with an application of 1HF:3 HNO$_3$:8 HAc.

11. A method for fabricating a silicon-on-insulator substrate, comprising:
    oxidizing a surface of a silicon handle wafer, resulting in an oxidized surface on the silicon handle wafer;
    epitaxially depositing a highly boron doped (p$^{++}$) single crystal layer as an etch-stop layer on a surface of a silicon device wafer;
    epitaxially depositing lightly boron doped (p$^-$) silicon layer as a device layer on the etch-stop layer;
    conditioning a first surface of the silicon device layer and the oxidized surface of the silicon handle wafer to be hydrophilic;
    bonding, at room temperature, the first surface of the silicon device layer and the oxidized surface of the silicon handle wafer to each other, resulting in bonded surfaces;
    sealing the bonded surfaces at a bond perimeter with a sealant;
    removing a significant portion of the silicon device wafer by grinding;
    etching away the remaining portion of the silicon device wafer;
    etching away the etch-stop layer, to expose a second surface of the silicon device layer wherein said removing and etching steps are performed at room temperature; and
    annealing the bonding of the first surface of the silicon device layer and the oxidized surface of the silicon handle wafer.

12. The method of claim 11 wherein the resulting silicon device layer has a thickness at a value between 0.01 and 2.0 microns, with a surface variation of plus and minus 75 Angstroms.

13. The method of claim 12 further comprising:
    thermally forming an oxide on the second surface of the silicon device layer; and
    removing the oxide on the second surface of the silicon device layer to make the silicon device layer thinner.

14. The method of claim 13 wherein the conditioning of the first surface of the silicon device layer and the oxidized surface of the silicon handle wafer is effected by cleaning the first surface and the oxidized surface with an RCA solution.

15. The method of claim 14 wherein:
    the remaining portion of the silicon device wafer, that is etched away, has a thickness between twenty and fifty microns; and
    the etch-stop layer has a thickness of about two microns.

16. The method of claim 14 wherein the annealing of the bonding of the first surface of the silicon device layer and the oxidized surface of the silicon handle wafer is performed at approximately 1000 degrees Centigrade for improved bond strength between the bonded surfaces of the silicon device layer and the silicon handle wafer.

17. The method of claim 15 wherein:
    the silicon device wafer has a boron concentration of approximately $10^{15}$ atoms/cm$^3$;
    the etch-stop layer has a boron concentration of approximately $10^{20}$ atoms/cm$^3$; and
    the silicon device layer has a boron concentration less than $10^{15}$ atoms/cm$^3$.

18. The method of claim 17 wherein the etch-stop layer is co-doped with about ten percent germanium, to compensate tensile stress caused by small boron atoms with compressive stress caused by larger germanium atoms.

19. The method of claim 18 wherein:

the remaining portion of the silicon device wafer, that is etched away, is etched with ethylene diamine and pyrocatechol (EDP); and the etch-stop layer, that is etched, is etched away with 1HF:3 HNO$_3$:8 HAc etchant.

* * * * *

UNITED STATES PATENT AND TRADEMARK OFFICE
CERTIFICATE OF CORRECTION

PATENT NO. : 5,344,524
DATED : September 6, 1994
INVENTOR(S) : K.R. Sarma, M.S. Liu It is certified that error appears in the above-indentified patent and that said Letters Patent is hereby corrected as shown below:

On title page of this patent, inventors name should be corrected to read --Sarma--.

Signed and Sealed this

Fifth Day of September, 1995

Attest:

BRUCE LEHMAN

*Attesting Officer*      *Commissioner of Patents and Trademarks*